(12) United States Patent
Lesartre et al.

(10) Patent No.: US 10,983,865 B2
(45) Date of Patent: Apr. 20, 2021

(54) ADJUSTING MEMORY PARAMETERS

(71) Applicant: HEWLETT PACKARD ENTERPRISE DEVELOPMENT LP, Houston, TX (US)

(72) Inventors: Gregg B. Lesartre, Ft. Collins, CO (US); Martin Foltin, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 742 days.

(21) Appl. No.: 15/224,988

(22) Filed: Aug. 1, 2016

(65) Prior Publication Data

US 2018/0032400 A1    Feb. 1, 2018

(51) Int. Cl.
*G06F 11/14* (2006.01)
*G06F 3/06* (2006.01)

(52) U.S. Cl.
CPC .......... *G06F 11/142* (2013.01); *G06F 3/0619* (2013.01); *G06F 3/0629* (2013.01); *G06F 3/0673* (2013.01); *G06F 2201/805* (2013.01); *G06F 2201/81* (2013.01)

(58) Field of Classification Search
CPC ....... G06F 11/14; G06F 11/142; G06F 3/0619
USPC ...................................................... 714/6.11
See application file for complete search history.

(56) References Cited

U.S. PATENT DOCUMENTS

| | | | | |
|---|---|---|---|---|
| 5,627,789 A * | 5/1997 | Kalb, Jr. | ................. | G11C 7/06 365/194 |
| 8,477,549 B1 * | 7/2013 | Sood | ........................ | G11C 7/00 326/38 |
| 8,595,597 B2 * | 11/2013 | Xie | ..................... | G06F 11/1048 714/708 |
| 9,330,790 B2 * | 5/2016 | Kim | ................. | G11C 29/50004 |
| 2008/0072116 A1 * | 3/2008 | Brittain | ................. | G06F 11/073 714/758 |
| 2008/0222490 A1 * | 9/2008 | Leung | ................. | G06F 11/1068 714/763 |
| 2010/0002512 A1 * | 1/2010 | Cornwell | ............... | G11C 29/88 365/185.09 |
| 2010/0332922 A1 * | 12/2010 | Chang | ................. | G06F 12/0246 714/704 |
| 2011/0126073 A1 * | 5/2011 | Nieuwland | ......... | G06F 11/1008 714/752 |
| 2011/0173484 A1 * | 7/2011 | Schuette | ............. | G06F 11/0727 714/2 |
| 2012/0239256 A1 * | 9/2012 | Hammerschmidt | .. | H04L 1/0061 701/45 |
| 2013/0024735 A1 * | 1/2013 | Chung | ................ | G06F 11/1048 714/704 |
| 2013/0094288 A1 * | 4/2013 | Patapoutian | ........... | G11C 16/06 365/185.03 |

(Continued)

OTHER PUBLICATIONS

Csaba Soos et al., "FPGA-based Bit-Error-Ratio Tester for SEU-hardened Optical Links," TWEPP'09, Sep. 21-25, 2009, pp. 1-19.

*Primary Examiner* — Kamini B Patel

(74) *Attorney, Agent, or Firm* — Hewlett Packard Enterprise Patent Department

(57) ABSTRACT

In various examples, a device comprises a memory. The memory comprises a plurality of dies and logic. The logic may: determine a tolerable bit error rate (BER) of the memory based on whether one of the plurality of dies has failed, and adjust a parameter of the memory based on the tolerable BER.

15 Claims, 5 Drawing Sheets

(56) References Cited

U.S. PATENT DOCUMENTS

| | | | |
|---|---|---|---|
| 2014/0380108 A1* | 12/2014 | Goldman | G06F 11/1048 714/721 |
| 2015/0349807 A1* | 12/2015 | Vernon | H03M 13/353 714/774 |
| 2015/0378801 A1* | 12/2015 | Navon | G06F 11/076 714/704 |
| 2016/0098355 A1* | 4/2016 | Gorobets | G06F 12/1009 711/203 |
| 2017/0139761 A1* | 5/2017 | Song | G06F 11/079 |

* cited by examiner

ADJUSTING MEMORY PARAMETERS

BACKGROUND

Computing devices may be coupled to memories. The memories may execute read and write operations.

BRIEF DESCRIPTION OF THE DRAWINGS

Certain examples are described in the following detailed description and in reference to the drawings, in which.

DETAILED DESCRIPTION

Memory devices may store data across multiple dies. The dies may comprise bits that are used to store error correcting data, referred to as error correcting codes (ECC). The ECC data may be combined with the other non-ECC bits using a mathematical function to reconstruct data stored in a cache line in the event that one or more bits of data of the cache line have erroneous values.

In some instances, one of the memory dies may fail. In this situation, it is desirable to allow the memory to continue operating normally. However, due the reduced number of bits available, the memory device has to operate with a lower bit error rate (BER) in order to function properly. A memory controller as described herein adjusts various electrical parameters used to control a memory device based on a tolerable bit error rate (BER) of the device.

For example, if a memory device has eight dies, and all dies are working properly, a memory controller may determine that the memory can tolerate a higher BER because more bits are available to use as part of an ECC scheme and therefore, more erroneous bits are correctable. Based on the determination that a higher BER is tolerable, the memory controller may adjust or set one or more parameters used to control operation of the memory device in some examples. For example, the memory controller may utilize a lower amount of current used to write data to the memory, or allow a shorter amount of time that sense amplifiers are active when reading the memory.

In the event that a memory die fails and there are fewer bits available to store data and ECC, and therefore the memory device cannot tolerate a higher BER. Based on the determination, the memory controller adjusts the operating parameters of the memory device in an attempt to decrease the BER. For example, the memory controller may increase the amount of current used when writing data to the memory die. The memory controller may also increase the amount of time before the sense amplifiers are triggered when reading data from the memory device.

Figure 1:
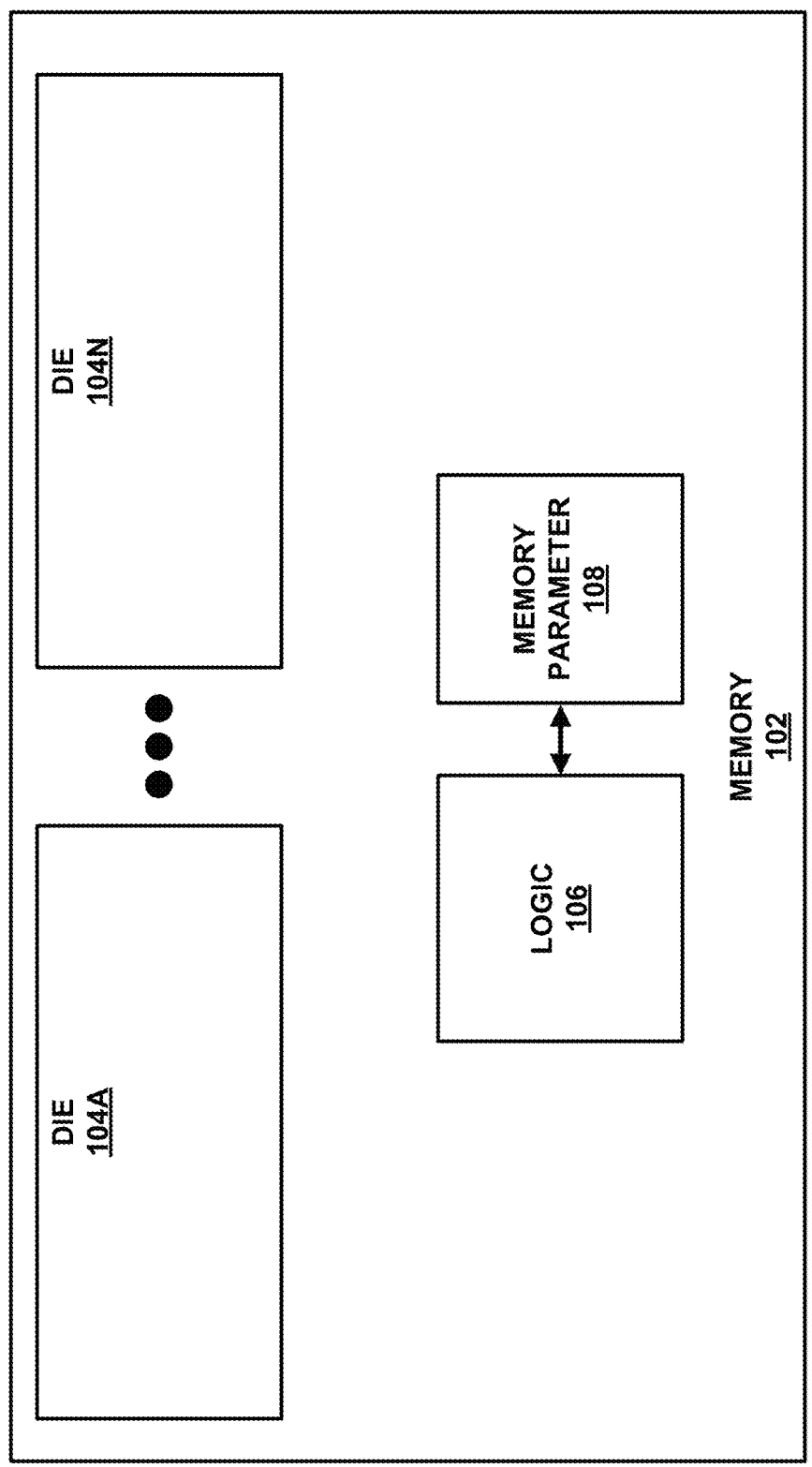
FIG. 1 is a conceptual diagram of an example device that may adjust a memory parameter based on a bit error rate.

FIG. 1 is a conceptual diagram of an example device that may adjust a memory parameter based on a bit error rate. FIG. 1 illustrates a computing device 100 comprising a memory 102. Memory 102 comprises a plurality of dies 104A-104N (collectively "dies 104"). Each of the dies may store a number of bits of data. Although two dies 104A and 104N are illustrated in FIG. 1 for the purpose of simplicity, memory 102 may comprise more than two dies.

Memory 102 uses an error correction coding (ECC) scheme to correct bit errors. Depending on the scheme used with memory 102, a number of the bits stored within dies 104 comprise ECC bits while the other bits comprise non-ECC data. In the event of bit errors, the ECC bits may be mathematically combined with the non-ECC bits to reconstruct the data stored in dies 104 without any bit errors.

A memory controller (not pictured) may be coupled to memory 102. The memory controller may control various aspects of the operation of memory 102. The memory controller may generate write requests to memory 102, which cause memory 102 to write data to dies 104. The memory controller may also generate read requests to memory 102, which cause memory 102 to read data from dies 104 and transmit the data to the memory controller.

Memory 102 comprises logic 106 and a memory parameter(s) 108. As will be described Memory parameter(s) 108 may comprise various parameters such as electrical parameters, temperature parameters, various latencies and numbers of cycles that are to be used to operate memory 102. Logic 106 may comprise logic, an application-specific integrated circuit (ASIC), firmware, a microcontroller, a field programmable gate array (FPGA), the like, or any combination thereof. Logic 106 may control the operation of memory 102, and may determine and alter memory parameter(s) 108.

Logic 106 may determine a tolerable bit error rate (BER) of bit errors for memory 102, i.e. a rate of bit errors that memory 102 can tolerate and still function properly. When memory 102 is initialized for the first time, logic 106 may assume an initial baseline BER and may set baseline memory parameters. If Logic 106 determines that memory 102 is operating normally, i.e. that none of dies 104 have failed, Logic 106 may determine that the tolerable BER 106 has not changed, and may not adjust memory parameter(s) 108.

During operation of memory 102, logic 106 may determine that the tolerable BER for memory 102 has changed if one of dies 104 has failed. Based on the determination, logic 106 may adjust at least one of memory parameter(s) 108 because due to the failed die, fewer ECC and data bits of dies 104 are available to correct bit errors. Responsive to determining a lower tolerable BER, memory 102 may adjust at least one of memory parameter(s) 108 in an attempt to lower the BER of memory 102 to match the tolerable BER. In various examples, the reconfiguration of memory parameter(s) 108 may be across a single memory device as illustrated in FIG. 1.

Various examples of adjusting memory parameter(s) 108 will now be described. One memory parameter that logic 106 may adjust is a rate at which memory 102 performs scrub operations. Memory 102 may periodically perform data scrub operations. The data scrub operations may check lines of memory for, and correct any found bit errors. Responsive to determining that one of dies 104 has failed, memory 102 may adjust the rate (i.e. increase) at which data scrub operations are performed. By increasing the rate at which data scrub operations are performed, memory 102 may correct individual bit errors before the number of bit errors in a line of memory become too numerous to be correctable.

Responsive to determining that one of dies 104 has failed, memory 102 may adjust a latency to wait for read signals to stabilize when reading data from dies 104 in some examples. In other examples, adjusting memory parameter(s) 108 may comprise adjusting at least one write parameter. For example, memory 102 may adjust (e.g. increase) a number of write cycles used to write data to dies 104 during a write operation, or (e.g. increase) the latency of a write cycle when writing data to memory 102.

In various examples, memory 102 may adjust a physical or electrical parameter of memory 102 responsive to determining that one of dies 104 has failed. For example, memory 102 may adjust an electrical parameter of memory 102. Memory 102 may use more aggressive (i.e. higher) read and/or write voltages and/or currents responsive to determining that at least one of dies 104 has failed. Memory 102 may also use different write validation and read sensing thresholds that may be skewed in favor of one bit logic value over the other logic value. Using more aggressive electrical parameters may tradeoff device endurance for a lower BER.

In other examples, memory 102 may attempt to lower the temperature of memory 102. To lower the temperature of memory 102, logic 106 may reduce an allowable activity level, e.g. the number of operations per time that memory 102 may perform. Reducing the number of allowable operations may also improve power supply stability to memory 102, which may lower the BER of memory 102. Memory 102 may also signal the systems cooling system to increase its cooling capacity, such as increasing fan speeds.

Figure 2:
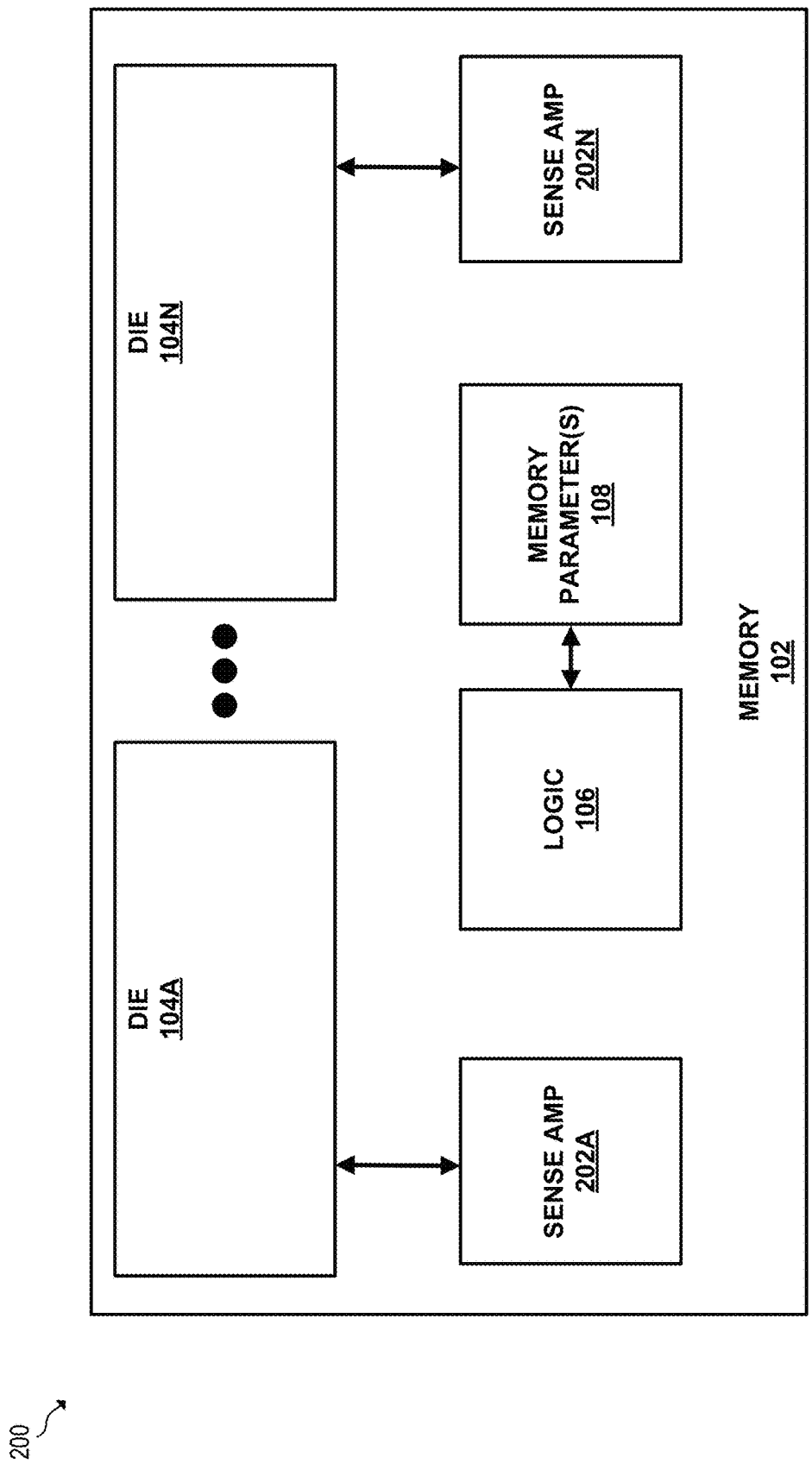
FIG. 2 is another conceptual diagram of an example device that may adjust a memory parameter based on a bit error rate.

FIG. 2 is a conceptual diagram of an example device that may adjust a memory parameter based on a bit error rate. Computing device 200 comprises a memory 102, which may be similar to memory 102 of FIG. 1. Memory 102 comprises a plurality of dies 104, logic 106, and at least one memory parameter(s) 108, as in FIG. 1.

In addition to the aforementioned components, each of dies 104A-104N are associated with at least one respective sense amplifier 202A-202N (collectively "sense amps 202"). Each sense amp is a circuit that is used to read a row of bits (i.e. voltages or currents corresponding to bit values) from the respective die.

As described above, logic 106 may determine, e.g. based on a failure of one of dies 104, a lower BER that memory 102 can tolerate. Responsive to logic 106 determining a lower tolerable BER for memory 102, logic 106 may alter at least one of memory parameter(s) 108 associated with sense amps 202. As one non-limiting example, during a read operation, to memory 102, logic 106 may increase a latency to wait for signals from dies 104 to stabilize before triggering sense amps 202.

Figure 3:
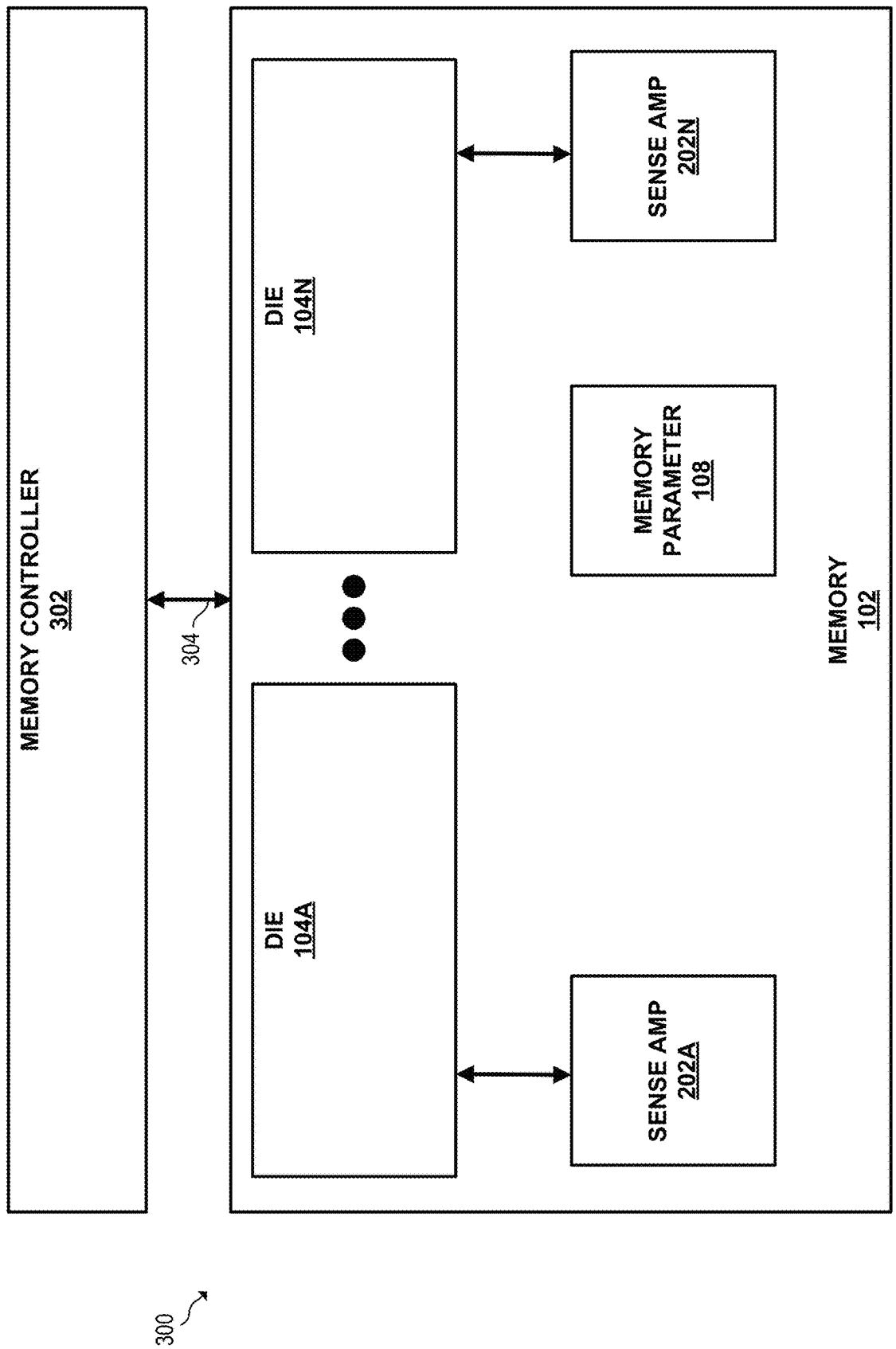
FIG. 3 is a conceptual diagram of an computing system that may adjust a memory parameter based on a bit error rate.

FIG. 3 is a conceptual diagram of a computing system that may adjust a memory parameter based on a bit error rate. The example of FIG. 3 is similar to FIG. 1. However, in the example of FIG. 3, a memory controller 302 is coupled to memory 102. Memory controller 302 may control various aspects of memory 102, such as at least one memory parameter 108 of memory 102.

In the example of FIG. 3, memory controller is coupled to memory 102 via a memory interface 304. Memory controller 302 and memory 102 transmit and receive read and write data via memory interface 304 responsive to read and write requests bound for memory 102. Memory controller 302 may comprise a single device, or multiple devices. In various examples, memory controller 302 may comprise one or more of logic, an ASIC, FPGA, microcontroller, or a processor. In some examples, memory controller 302 may be integrated within a processor, such as a central processing unit (CPU).

In the example of FIG. 3, memory controller 302 may determine a tolerable BER for memory 102. Memory controller 302 may determine the tolerable BER based on a determination of whether one of dies 104 has failed. If none of dies 104 have failed, memory controller 302 may determine a first tolerable BER for memory 102. The first BER may comprise a baseline tolerable BER, and memory controller 302 may select baseline values of memory parameter(s) 108 for the operation of memory 102.

If memory controller 302 determines that one of dies 104 has failed, memory controller 302 may determine a second, lower tolerable BER for memory 102. Based on this determination, memory controller 302 may adjust at least one of memory parameter(s) 108. As described elsewhere, the parameters that memory controller 302 adjusts may comprise at least one of: a rate of performing data scrub operations, a latency to wait for read signals to stabilize, a number of write cycles, a latency of a write cycle, a temperature of the memory, or an electrical parameter of memory 102.

Figure 4:
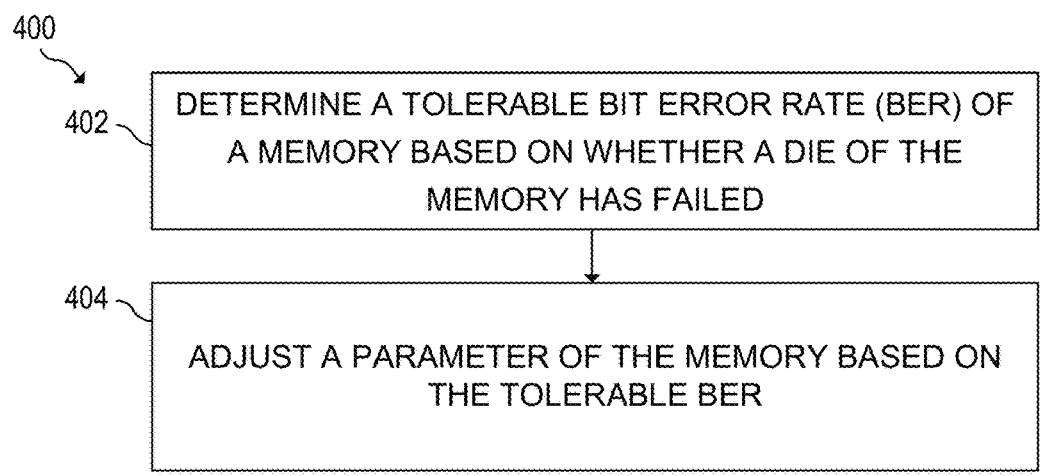
FIG. 4 is a flowchart of an example method for adjusting a memory parameter based on a bit error rate.

FIG. 4 is a flowchart of an example method for performing write tracking. FIG. 4 illustrates method 400. Method 400 may be described below as being executed or performed by a system, for example, memory 102 (FIG. 1), memory 102 (FIG. 2), or computing system 300 (FIG. 3).

In various examples, method 400 may be performed by hardware, software, firmware, or any combination thereof. Other suitable systems and/or computing devices may be used as well. Method 400 may be implemented in the form of executable instructions stored on at least one machine-readable storage medium of the system and executed by at least one processor of the system. Alternatively or in addition, method 400 may be implemented in the form of electronic circuitry (e.g., hardware). In alternate examples of the present disclosure, one or more blocks of method 400 may be executed substantially concurrently or in a different order than shown in FIG. 4. In alternate examples of the present disclosure, method 400 may include more or fewer blocks than are shown in FIG. 4. In some examples, one or more of the blocks of method 400 may, at certain times, be ongoing and/or may repeat.

Method 400 may start at block 402 at which point memory 102 or memory controller 302 may determine a tolerable bit error rate (BER) of a memory based on whether a die (e.g. one of dies 104) of the memory has failed.

At block 404, responsive to determining the BER, memory 102 or memory controller 302 may adjust a parameter (e.g. at least one of memory parameter(s) 108) of the memory. In various examples, to adjust the parameter, the memory or memory controller may adjust a rate of performing data scrub operations on the memory. In various examples, to adjust the parameter, the memory and/or memory controller may increase at least one of: a number of write cycles, or a latency of a write cycle used to write data to the memory.

In other examples, the parameter to adjust may comprise a latency to wait for read signals to stabilize, and memory 102 and/or memory controller 302 may cause logic 106 of memory 102 or memory controller 302 to adjust the latency to wait before triggering read sense amplifiers (e.g. sense amps 202) of the memory.

In various examples, memory controller 302 or memory 102 may adjust the temperature of the memory or an electrical parameter used to read or write the memory.

Figure 5:
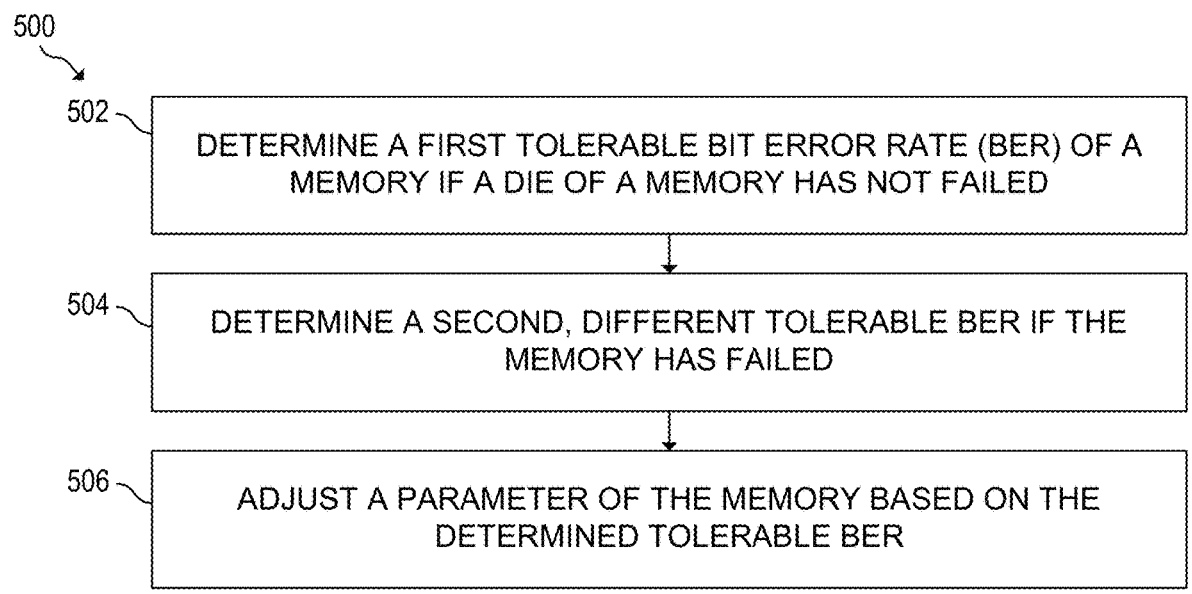
FIG. 5 is a flowchart of another example method for adjusting a memory parameter based on a bit error rate.

FIG. 5 is a flowchart of an example method for performing write tracking. FIG. 5 illustrates method 500. Method 500 may be described below as being executed or performed by a system, for example, memory 102 (FIG. 1, FIG. 2), or computing system 300 (FIG. 3). Other suitable systems and/or computing devices may be used as well. Method 500 may be implemented in the form of executable instructions stored on at least one machine-readable storage medium of the system and executed by at least one processor of the system. Method 500 may be performed by hardware, software, firmware, or any combination thereof.

Alternatively or in addition, method 500 may be implemented in the form of electronic circuitry (e.g., hardware). In alternate examples of the present disclosure, one or more blocks of method 500 may be executed substantially concurrently or in a different order than shown in FIG. 5. In alternate examples of the present disclosure, method 500 may include more or fewer blocks than are shown in FIG. 5. In some examples, one or more of the blocks of method 500 may, at certain times, be ongoing and/or may repeat.

In various examples, method 500 may start at block 502 at which point a memory or memory controller (e.g. memory 102 or memory controller 302) may determine a first tolerable BER if a die (e.g. one of dies 104) of memory 102 has not failed. At block 504, the memory or memory controller may determine a second, different tolerable BER if a die of the memory has failed.

At block 506, the memory or memory controller may adjust a parameter (e.g. at least one of parameter(s) 108) of the memory based on the determined tolerable BER. In various examples, adjust the parameter may comprise adjusting at least one of a rate of performing data scrub operations, a latency to wait for read signals to stabilize, a number of write cycles, a latency of a write cycle, a temperature of the memory, or an electrical parameter of the memory.

The invention claimed is:

1. A method comprising:
determining a tolerable bit error rate (BER) of a memory based on whether a die of the memory has failed, the tolerable BER indicating a threshold under which the memory is to operate;
responsive to determining the tolerable BER, adjusting a parameter of the memory based on the tolerable BER, the memory correspondingly operating at a BER under the tolerable BER.

2. The method of claim 1, wherein determining the tolerable BER comprises:
determining a first tolerable BER if a die of the memory has not failed; and
determining a second, different tolerable BER if a die of the memory has failed, wherein adjusting the parameter comprises:
adjusting at least one of: a rate of performing data scrub operations, a latency to wait for read signals to stabilize, a number of write cycles, a latency of a write cycle, a temperature of the memory, or an electrical parameter of the memory.

3. The method of claim 1, wherein adjusting the parameter comprises a rate of performing data scrub operations on the memory, the method comprising:
adjusting the rate of performing the data scrub operations on the memory.

4. The method of claim 1, wherein adjusting the parameter comprises:
increasing at least one of: a number of write cycles, or a latency of a write cycle used to write data to the memory.

5. The method of claim 1, wherein the parameter comprises a latency to wait for read signal levels to stabilize, the method comprising:
causing the memory to adjust the latency to wait before triggering read sense amplifiers of the memory.

6. The method of claim 1, wherein the parameter comprises a temperature of the memory, the method comprising:
adjusting the temperature of the memory based on the tolerable BER.

7. The method of claim 1, wherein the parameter comprises an electrical parameter of the memory, the method comprising:
adjusting an electrical parameter used to read or write the memory.

8. A device comprising a memory, the memory comprising:
a plurality of dies; and
logic, the logic to:
determine a tolerable bit error rate (BER) of the memory based on whether one of the plurality of dies has failed, the tolerable BER indicating a threshold under which the memory is to operate; and
adjust a parameter of the memory based on the tolerable BER, the memory correspondingly operating at a BER under the tolerable BER.

9. The device of claim 8, the logic to:
determine a first tolerable BER if a die of the memory has not failed; and
determine a second, different tolerable BER if a die of the memory has failed,
wherein to adjust the parameter of the memory, the logic to adjust at least one of: a rate of performing data scrub operations, a latency to wait for read signals to stabilize, a number of write cycles, a latency of a write cycle, a temperature of the memory, or an electrical parameter of the memory.

10. The device of claim 8, wherein the parameter comprises a rate of performing data scrub operations on the memory, the logic to:
adjust the rate of performing the data scrub operations based on the tolerable BER.

11. The device of claim 8, comprising:
read sense amplifiers coupled to the dies,
wherein the parameter comprises a latency to wait for read signal levels to stabilize, the logic to:
adjust the latency to wait for read signal levels to stabilize before triggering the read sense amplifiers based on the tolerable BER.

12. The device of claim 8, wherein the parameter comprises a temperature of the memory, the logic to:
adjust the temperature of the memory based on the tolerable BER.

13. The device of claim 8, the logic to:
adjust, based on the tolerable BER, an electrical parameter used to read or write the memory.

14. A system comprising:
a memory comprising a plurality of dies; and
a memory controller coupled to the memory, the memory controller to:
determine a tolerable bit error rate (BER) of the memory based on whether one of the plurality of dies has failed, the tolerable BER indicating a threshold under which the memory is to operate; and
adjust a parameter of the memory based on the tolerable BER, the memory correspondingly operating at a BER under the tolerable BER.

15. The system of claim 14,
the memory controller to:
determine a first tolerable BER if one of the dies of the memory has not failed; and
determine a second, different tolerable BER if one of the dies has failed,
wherein to adjust the parameter of the memory, the memory controller to adjust at least one of:
a rate of performing data scrub operations, a latency to wait for read signals to stabilize, a number of write cycles, a latency of a write cycle, a temperature of the memory, or an electrical parameter of the memory.

* * * * *